(12) United States Patent
Lee et al.

(10) Patent No.: US 10,923,549 B2
(45) Date of Patent: Feb. 16, 2021

(54) DISPLAY APPARATUS INCLUDING A SHIELDING CONDUCTIVE LAYER

(71) Applicant: SAMSUNG DISPLAY CO., LTD., Yongin-si (KR)

(72) Inventors: Wonse Lee, Yongin-si (KR); Kyunghoon Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/713,735

(22) Filed: Dec. 13, 2019

(65) Prior Publication Data
US 2020/0194529 A1 Jun. 18, 2020

(30) Foreign Application Priority Data
Dec. 13, 2018 (KR) .......... 10-2018-0161174

(51) Int. Cl.
H01L 27/00 (2006.01)
H01L 27/32 (2006.01)
H01L 49/02 (2006.01)
H01L 23/58 (2006.01)
H01L 27/12 (2006.01)
G09G 3/3275 (2016.01)
G09G 3/3266 (2016.01)
G09G 3/3258 (2016.01)

(52) U.S. Cl.
CPC ........ *H01L 27/3272* (2013.01); *H01L 23/585* (2013.01); *H01L 27/3262* (2013.01); *H01L 27/3265* (2013.01); *H01L 27/3279* (2013.01); *H01L 28/60* (2013.01); *G09G 3/3258* (2013.01); *G09G 3/3266* (2013.01); *G09G 3/3275* (2013.01); *G09G 2310/0202* (2013.01); *H01L 27/124* (2013.01); *H01L 27/1255* (2013.01)

(58) Field of Classification Search
None
See application file for complete search history.

(56) References Cited

U.S. PATENT DOCUMENTS

| 8,633,490 | B2 | 1/2014 | Park et al. |
| 8,730,141 | B2 | 5/2014 | Hou et al. |
| 8,779,429 | B2 | 7/2014 | Seo et al. |
| 2016/0365042 | A1 | 12/2016 | Zheng et al. |
| 2018/0331124 | A1* | 11/2018 | Cho ............... H01L 27/3276 |

FOREIGN PATENT DOCUMENTS

| KR | 10-2013-0102387 | 9/2013 |
| KR | 10-2015-0061442 | 6/2015 |
| KR | 10-2018-0049820 | 5/2018 |

* cited by examiner

Primary Examiner — Reema Patel
(74) Attorney, Agent, or Firm — F. Chau & Associates, LLC

(57) ABSTRACT

A display apparatus including a shielding conductive layer is disclosed. The display apparatus includes a substrate, a driving thin film transistor disposed on the substrate, wherein the driving thin film transistor includes a driving semiconductor layer and a driving gate electrode, a scan line overlapping the substrate and extending in a first direction, a data line extending in a second direction crossing the first direction, wherein the data line is insulated from the scan line by an insulating layer, a node connection line disposed on a same layer as the scan line, and a shielding conductive layer disposed between the data line and the node connection line, in which a first end of the node connection line is connected to the driving gate electrode via a first node contact hole.

23 Claims, 7 Drawing Sheets

DISPLAY APPARATUS INCLUDING A SHIELDING CONDUCTIVE LAYER

CROSS-REFERENCE TO RELATED APPLICATION

This application claims priority under 35 U.S.C. § 119 to Korean Patent Application No. 10-2018-0161174, filed on Dec. 13, 2018, in the Korean Intellectual Property Office, the disclosure of which is incorporated by reference herein in its entirety.

TECHNICAL FIELD

The present invention relates to a display apparatus, and more particularly, to a display apparatus including a shielding conductive layer.

DESCRIPTION OF THE RELATED ART

Display apparatuses are apparatuses for displaying an image and may Inc ode liquid crystal displays, electrophoretic displays organic light-emitting displays, inorganic light-emitting (EL) displays, field emission displays, surface-conduction electron-emitter displays, plasma displays, or cathode ray displays.

Display apparatuses that display an image in response to received data may include a substrate. A substrate included in a display apparatus may be sectioned into a display area and a peripheral area. The display area may be provided with a scan line and a data line that are insulated from each other, and a plurality of pixels connected thereto. The display area may include a thin film transistor corresponding to each of the pixels and a pixel electrode electrically connected to the thin film transistor. Furthermore, the display area may be provided with a counter electrode that is commonly connected with the plurality of pixels. The peripheral area may be provided with various wirings for transmitting electric signals to the display area, a scan driver, a data driver, and/or a controller.

Display apparatus versatility of use increases as the thicken and weight of the display apparatus decrease. For high quality and high resolution of a display apparatus, the design of a pixel circuit included in a pixel is diversified.

SUMMARY

An exemplary embodiment of the present invention discloses a display apparatus including a shielding conductive layer for implementing a high quality image.

An exemplary embodiment of the present invention discloses a display apparatus comprising a substrate. A driving thin film transistor is disposed on the substrate, wherein the driving thin film transistor includes a driving semiconductor layer and a driving gate electrode. A scan line overlaps the substrate and extends in a first direction. A data line extends in a second direction crossing the first direction, wherein the data line is insulated from the scan line by an insulating layer disposed therebetween. A node connection line is disposed on a same layer as the scan line. A shielding conductive layer is disposed between the data line and the nod a connection line. A first end of the node connection line is connected to the driving gate electrode via a first node contact hole.

An exemplary embodiment of the present invention discloses a storage capacitor overlapping the driving thin film transistor and having a lower electrode and an upper electrode, wherein the shielding conductive layer extends from a side of the upper electrode.

An exemplary embodiment of the present invention discloses the lower electrode of the storage capacitor is connected to the driving gate electrode of the driving thin film transistor.

An exemplary embodiment of the present invention discloses a driving voltage line extending in the second direction and disposed on a same layer as the data line, wherein the shielding conductive layer is connected to the driving voltage line.

An exemplary embodiment of the present invention discloses a compensation thin film transistor connected to the scan line and including a compensation semiconductor layer and a compensation gate electrode. A semiconductor connection line extends from the compensation semiconductor layer. A second end of the node connection line is connected to the semiconductor connection line via a second node contact hole.

An exemplary embodiment of the present invention discloses each of the shielding conductive layer and the semiconductor connection line includes a portion extending in the second direction.

An exemplary embodiment of the present invention discloses a resistance value of the scan line is less than a resistance value of the driving gate electrode.

An exemplary embodiment of the present invention discloses a storage capacitor in which the driving gate electrode, functions as a lower electrode of the storage capacitor. An upper electrode is overlaps the lower electrode and has a storage opening. The first node contact hole is disposed in the storage opening.

An exemplary embodiment of the present invention discloses a size of the storage opening is greater than a size of the first node contact hole.

An exemplary embodiment of the present invention discloses an emission control thin film transistor is disposed on the substrate and includes an emission control semiconductor layer and an emission control gate electrode. An emission control signal is transmitted to the emission control gate electrode through the emission control lines, wherein the emission control gate electrode is provided as a part of the emission control lines.

An exemplary embodiment of the present invention discloses a display apparatus comprising a substrate. A driving thin film transistor is disposed on the substrate and has a driving gate electrode and a driving semiconductor layer. A first gate insulating layer is disposed between the driving gate electrode and the driving semiconductor layer. A second gate insulating layer covers the driving gate electrode. A shielding conductive layer is disposed on the second gate insulating layer. An interlayer insulating layer covers the shielding conductive layer. A node connection line is disposed on the interlayer insulating layer and is connected to the driving gate electrode via a first node contact hole penetrating the interlayer insulating layer and the second gate insulating layer. A scan line is disposed on a same layer as the node connection line and extends in a first direction. A via layer covers the scan line and the node connection line. A data line is disposed on the via layer and extends in a second direction crossing the first direction. The shielding conductive layer extends in the second direction between the data line and the node connection line.

An exemplary embodiment of the present invention discloses that a resistance value of the scan line is less than a resistance value of the driving gate electrode.

An exemplary embodiment of the present invention discloses a storage capacitor overlapping the driving thin film transistor and having a lower electrode and an upper electrode, wherein the shielding conductive layer extends from the upper electrode in the second direction.

An exemplary embodiment of the present invention discloses the lower electrode of the storage capacitor is integrally formed with the driving gate electrode of the driving thin film transistor.

An exemplary embodiment of the present invention discloses the upper electrode has a storage opening, the storage opening has a closed curve shape, and the first node contact hole is disposed in the storage opening.

An exemplary embodiment of the present invention discloses the driving semiconductor layer is bent.

An exemplary embodiment of the present invention discloses a driving voltage line extending in the second direction and disposed on a same layer as the data line, wherein the shielding conductive layer receives a direct current (DC) voltage through the driving voltage line.

An exemplary embodiment of the present invention discloses a compensation thin film transistor connected to the scan line and including a compensation semiconductor layer and a compensation gate electrode. A semiconductor connection line extends from the compensation semiconductor layer, wherein an end of the node connection line is connected to the semiconductor connection line via a second node contact hole.

An exemplary embodiment of the present invention discloses a shielding conductive layer and the semiconductor connection line include a portion extending in the second direction.

An exemplary embodiment of the present invention discloses an emission control thin film transistor disposed on the substrate and including an emission control semiconductor layer and an emission control gate electrode. An organic light-emitting diode is connected to the emission control thin film transistor.

An exemplary embodiment of the present invention discloses that the portion of the shielding conductive layer extending in the second direction is longer than the portion of the semiconductor connection line extending in the second direction.

An exemplary embodiment of the present invention discloses that the node connection line includes a portion extending in the second direction and the portion of the shielding conductive layer extending in the second direction longer than the portion of the node connection line extending the second direction.

An exemplary embodiment of the present invention discloses that the shielding conductive layer is disposed between a via of the data line and the second node contact hole and at least partially surrounds both.

BRIEF DESCRIPTION OF THE DRAWINGS

The above and other features of the present invention will be more clearly understood from the following detailed description taken in conjunction with the accompanying drawings, in which.

DETAILED DESCRIPTION OF THE EMBODIMENTS

Figure 1:
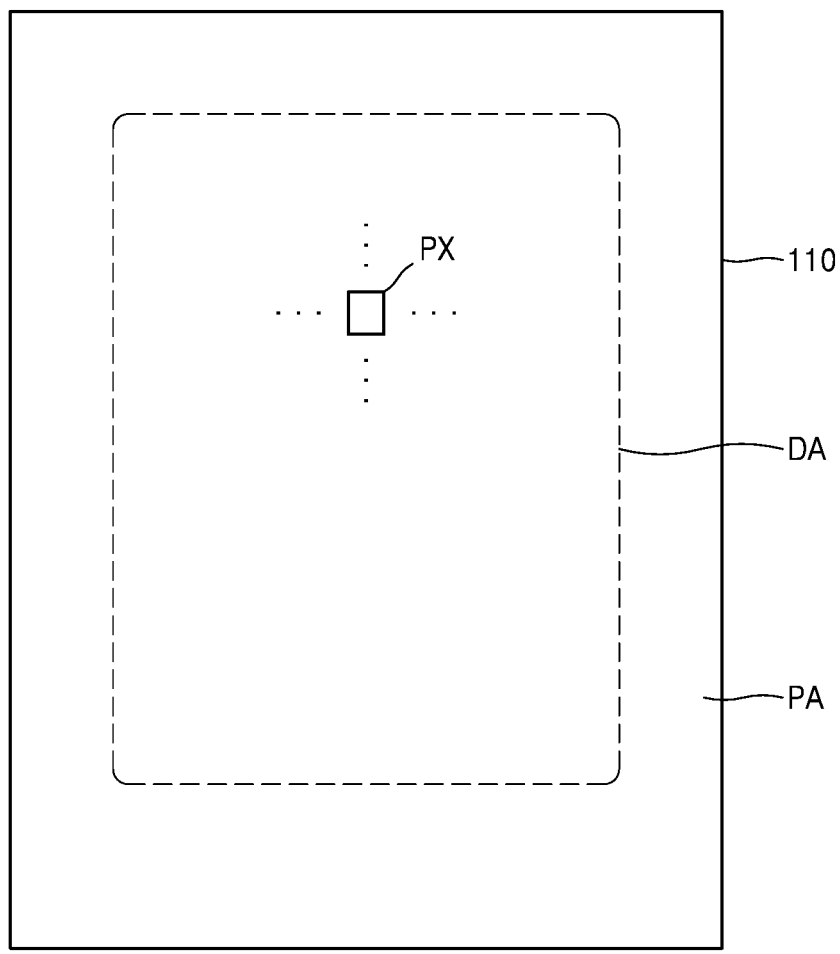
FIG. 1 schematically illustrates a display apparatus according to an exemplary embodiment of the present invention.

Exemplary embodiments of the present invention will now be described ore fully with reference to the accompanying drawings. However, the invention may be embodied in many alternate forms and should not be construed as limited to only the exemplary embodiments of the present disclosure set forth herein. It be understood that like reference numerals may refer to like elements throughout the detailed description and accompanying figures.

In the following embodiments, the singular forms "a," "an" and "the" are intended to include the plural forms as well, unless the context clearly indicates otherwise.

In the following embodiments, it will be further understood that the terms "comprises" and/or "comprising" used herein specify the presence of stated features or components, but do, not preclude the presence or addition of one or more other features or components.

In the following embodiments, it will be understood that when a layer area, or component is referred to as being "formed on" another layer, area, or component, it can be directly or indirectly formed on the other layer, area, or component. In other words, intervening layers, areas, or components may be present.

In the figures, sizes of components may be exaggerated for convenience of explanation. In other words, since sizes and thicknesses of components in the drawings are arbitrarily illustrated for convenience of explanation, the following embodiments are not limited thereto.

In the following embodiments, it will be understood that when a layer, area, or component is referred to as being "connected to" another layer, area, or component, it can be directly connected to the other layer, area, or component or indirectly connected to the other layer, area, or component via intervening layers, areas, or components. For example, in the present specification, when a layer, area, or component is referred to as being electrically connected to another layer, area, or component, it can be directly electrically connected to the other layer, area, or component, or indirectly electrically connected to the other layer, area, or component via intervening layers, areas, or components.

In the following description, an organic light-emitting display apparatus is described as a display apparatus according to an exemplary embodiment of the present invention, but the present, invention is not limited thereto and various types of display apparatuses may be used.

FIG. 1 schematically illustrates a display apparatus according to an exemplary embodiment of the present invention.

Referring to FIG. 1, a display apparatus may include a display area DA and a peripheral area PA that is a non-display area. Pixels PX including an organic light-emitting diode may be arranged in the display area DA to provide a certain image. The peripheral area PA may be an area that does not display an image. The peripheral area PA may include a scan driver and a data driver for providing electric signals to the pixels PX of the display area DA and power lines for supplying power such as a driving voltage and a common voltage.

Figure 2:
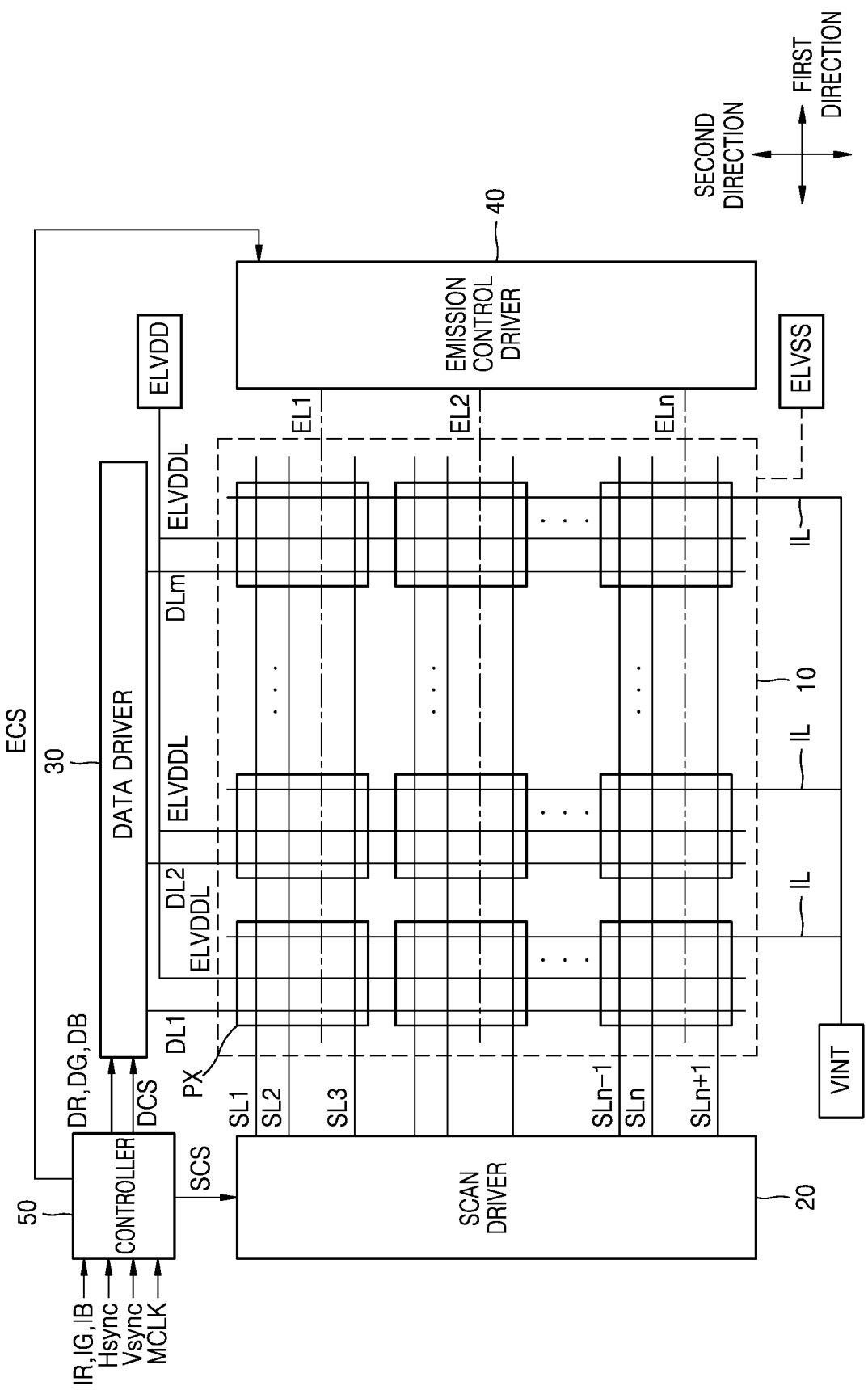
FIG. 2 is a block diagram schematically illustrating a display apparatus according to an exemplary embodiment of the present invention.

FIG. 2 is a block diagram schematically illustrating a display apparatus according to an exemplary embodiment of the present invention.

An organic light-emitting display apparatus according to an exemplary embodiment of the present invention may include a display portion 10 including a plurality of pixels PX, a scan driver 20, a data driver 30, an emission control driver 40, and a controller 50.

The display portion 10 is disposed in the display area DA, and may include the pixels PX located at intersections of a plurality of scan lines SL1 to SLn+1, a plurality of data lines DL1 to DLm, and a plurality of emission control lines EL1 to ELn, and arranged in a matrix. The scan lines SL1 to SLn+1 and the emission control lines EL1 to ELn may extend in a first direction that is a row direction, and the data lines DL1 to DLm and a driving voltage line ELVDDL may extend in a second direction that is a column direction. In one pixel line, a number of the scan lines SL1 to SLn+1 may be different from a number of the emission control lines EL1 to ELn. In other words, the number of scan lines SL1 to SLn+1 may be greater than the number of emission control lines EL1 to ELn.

Each of the pixels PX may be connected to three of the scan lines SL1 to SLn+1, the data driver 30, and the driving voltage line ELVDDL The scan driver 20 generates and transmits three scan signals to each of the pixels PX via scan lines SL1 to SLn+1. In other words, the scan driver 20 sequentially supplies scan signals via each of scan lines SL2-SLn, each of previous scan lines SL1-SLn−1, or each of subsequent scan lines SL3-SLn+1.

An initialization voltage line IL may receive an initialization voltage from an external power supply source VINT and supply the voltage to each of the pixels PX.

Furthermore, each of the pixels PX may be connected to one of the data lines DL1 to DLm, and one of the emission control lines EL1 to ELn.

The data driver 30 transmits a data signal to each of the pixels PX via data lines DL1 to DLm. Whenever a scan signal is supplied to each of the scan lines SL2-SLn, the data signal is supplied to one of the pixels PX that is selected by the scan signal.

The emission control driver 40 generates and transmits an emission control signal to each of the pixels PX via emission control lines EL1 to ELn. The emission control signal controls an emission period of the pixels PX. In other words, the emission control driver 40 transmitting the emission control signal to the emission control lines EL1 to ELn may determine a length of time during which the pixels PX transmit light and display an image. The emission control driver 40 may be omitted depending on the internal structure of the pixels PX.

The controller 50 may be configured to convey signals to each of the scan driver 20, the data driver 30, and the emission control driver 40. For example, the controller 50 may convert a plurality of image signals IR IG, and IB received from the outside to a plurality of image data signals DR, DG, and DB and transmit the converted signals to the data driver 30. Additionally, the controller 50 may receive a vertical sync signal Vsync, a horizontal sync signal Hsync, and a clock signal MCLK, generates a control signal to control driving of the scan driver 20, the data driver 30, and the emission control driver 40, and transmits the generated signal thereto. In other words, the controller 50 generates a scan driving control signal SCS for controlling the scan driver 20, a data driving control signal DCS for controlling the data driver 30, and an emission driving control signal ECS for controlling the emission control driver 40 and transmits the generated signals thereto.

Each of the pixels PX receives a driving power voltage ELVDD from the outside and a common power voltage ELVSS. The driving power voltage ELVDD may be a high level voltage, and the common power voltage ELVSS may be a ground voltage or a voltage lower than the driving power voltage ELVDD. The driving power voltage ELVDD may be supplied to each of the pixels PX via the driving voltage line ELVDDL.

Each of the pixels PX may emit light of a certain brightness by a drive current supplied to a light-emitting device according to a data signal transmitted via data lines DL1 to DLm.

Figure 3:
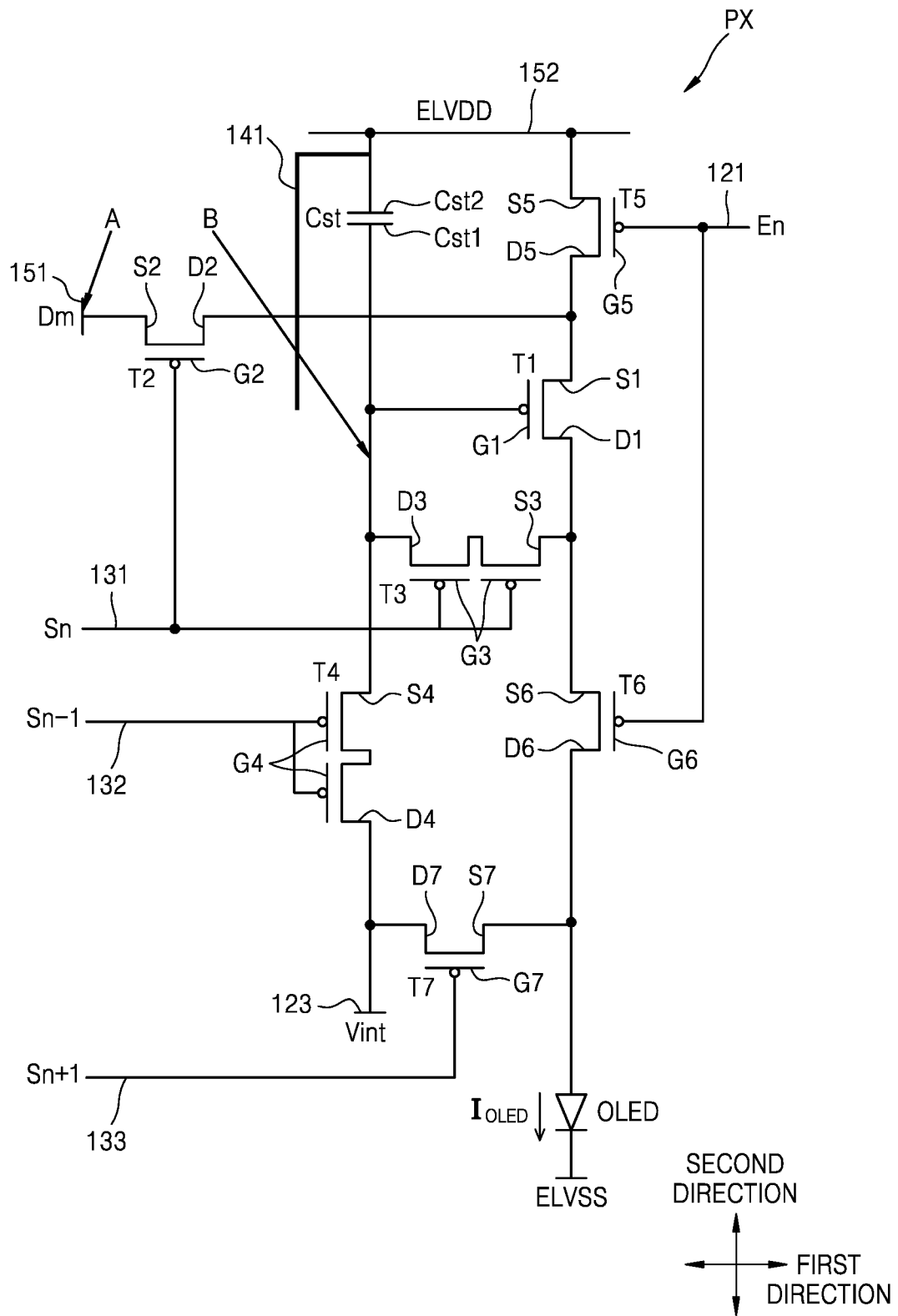
FIG. 3 is an equivalent circuit diagram of a pixel included in the display apparatus of FIG. 1.

FIG. 3 is an equivalent circuit diagram of a pixel included in the display apparatus of FIG. 1.

Referring to FIG. 3, the pixel PX may include signal lines 121, 131, 132, 133, and 151, a plurality of thin film transistors (TFTs) T1, T2, T3, T4, T5, T6, and T7 connected to the signal lines 121, 131, 132, 133, and 151, a capacitor Cst, an initialization voltage line 123, a driving voltage line 152, and the organic light emitting diode OLED.

Although FIG. 3 illustrates a case in which the signal lines 121, 131, 132, 133 and 151, the initialization voltage line 123, and the driving voltage line 152 are provided for every one of the pixels PX, the present invention is not limited thereto. In another embodiment of the present invention, at least one of the signal lines 121, 131, 132, 133, 151 and the initialization voltage line 123 may be shared by neighboring pixels.

The TFTs may include TFT S T1-T7. For example, TFTS T1-T7 may include a driving TFT T1, a switching TFT T2, a compensation TFT T3, a first initialization TFT T4, an operation control TFT T5, an emission control TFT T6, and a second initialization TFT T7.

The signal lines may include the scan line 131 for transmitting a scan signal S the previous scan line 132 for transmitting a previous scan signal Sn−1 to the first initialization TFT T4, the subsequent scan line 133 fore transmitting a subsequent scan signal Sn+1 to the second initialization TFT T7. Each of the scan lines 131-133 may be connected to the scan driver 20. The emission control line 121 may be connected to the emission control driver 40 and may be provided for transmitting an emission control signal En to the operation control TFT T5 and the emission control TFT T6. A data line 151 may be provided that is connected to the data driver 30 and may intersect the orthogonally disposed scan line 131 and transmit a data signal Dm to the pixel PX. The driving voltage line 152 may transmit the driving power voltage ELVDD to the driving TFT T1, and the initialization voltage line 123 may transmit an initialization voltage Vint for initializing the driving TFT T1 and a pixel electrode.

A driving gate electrode G1 of the driving TFT T1 may be connected to a lower electrode Cst1 of a storage capacitor Cst. A driving source electrode S1 of the driving TFT T1 is connected to the driving voltage line 152 via the operation control TFT T5. A driving drain electrode D1 of the driving TFT T1 may be electrically connected to the pixel electrode of the organic light emitting diode OLED via the emission control TFT T6. The driving TFT T1 may receive the data signal Dm based on a switching operation of the switching TFT T2 and supplies a driving current $I_{OLED}$ to the organic light emitting diode OLED.

A switching gate electrode G2 of the switching TFT T2 may be connected to the scan line 131. A switching source electrode S2 of the switching TFT T2 is connected to the data line 151. A switching drain electrode D2 of the switching TFT T2 may be connected to the driving source electrode S1 of the driving TFT T1 and also to the driving voltage line 152 via the operation control TFT T5. The switching TFT T2, when turned on by the scan signal Sn transmitted through the scan line 131, may perform a switching operation of transmitting the data signal Dm transmitted through the data line 151 to the driving source electrode S1 of the driving TFT T1.

A compensation gate electrode G3 of the compensation TFT T3 may be connected to the scan line 131. A compensation source electrode S3 of the compensation TFT T3 may be connected to the driving drain electrode D1 of the driving TFT T1 and also to the pixel electrode of the organic light emitting diode OLED via the emission control TFT TB. A compensation drain electrode D3 of the compensation TFT 13 may be connected to the lower electrode Cst1 of the storage capacitor Cst, a first initialization source electrode S4 of the first initialization TFT T4, and the driving gate electrode G1 of the driving TFT T1. The compensation TFT T3, when turned on by, the scan signal Sn transmitted through the scan line 131, may electrically connect the driving gate electrode G1 to the driving drain electrode D1 of the driving TFT T1, for example, by diode-connecting the driving TFT T1.

A first initialization gate electrode G4 of the first initialization TFT T4 may be connected to the previous scan line 132. The first initialization drain electrode D4 of the f initialization TFT T4 is connected to a second initialization drain electrode D7 of the second initialization TFT 17 and to the initialization voltage line 123. A first initialization source electrode S4 of the first initialization TFT 14 may be connected to the lower electrode Cst1 of the storage capacitor Cst, the compensation drain electrode D3 of the compensation TFT T3, and the driving gate electrode G1 of the driving TFT T1. The first initialization TFT T4, when turned on by the previous scan signal Sn−1 transmitted through the previous scan line 132, may perform an initialization operation of initializing a voltage of the driving gate electrode G1 of the driving TFT T1 by transmitting the initialization voltage Vint to the driving gate electrode G1 of the driving TFT T1.

An operation control gate electrode G5 of the operation control TFT T5 may be connected to the emission control line 121. An operation control source electrode S5 of the operation control TFT T5 may be connected to the driving voltage line 152. An operation control drain electrode D5 of the operation control TFT T5 may be connected to the driving source electrode S1 of the driving TFT T1 and the switchingdrain electrode D2 of the switching TFT T2.

An emission contra gate electrode G6 of the emission control TFT T6 may be connected to the emission control line 121. An emission control source electrode S6 of the emission control TFT 16 may be connected to the driving drain electrode D1 of the driving TFT T1 and the compensation source electrode S3 of the compensation TFT T3. An emission control drain electrode D6 of the emission control TFT T6 may be electrically connected to a second initialization source electrode S7 of the second initialization TFT T7 and the pixel electrode of the organic light emitting diode OLED. The emission control gate electrode G6 may be provided as a part of the emission control line 121.

The operation control TFT T5 and the emission control TFT 16 may be simultaneously turned on by the emission control signal En transmitted through the emission control line 121 and have the driving power voltage ELVDD transmitted to the organic light emitting diode OLED, thereby allowing the driving current $I_{OLED}$ to flow in the organic light emitting diode OLED.

A second initialization gate electrode G7 of the second initialization TFT T7 may be connected to the subsequent scan line 133. The second initialization source electrode S7 of the second initialization TFT T7 may be connected to the emission control drain electrode D6 of the emission control TFT T6 and the pixel electrode of the organic light emitting diode OLED. The second initialization drain electrode D7 of the second initialization TFT T7 may be connected to the first initialization drain electrode D4 of the first initialization TFT T4 and the initialization voltage line 123. The second initialization TFT T7 when turned on by the subsequent scan signal Sn+1 transmitted through the subsequent scan line 133, may initialize the pixel electrode of the organic light emitting diode OLED.

Although FIG. 3 illustrates a case in which the first initialization TFT T4 and the second initialization TFT T7 are respectively connected to the previous scan line 132 and the subsequent scan line 133 the present invention is not limited thereto. In another embodiment, both of the first initialization TFT 14 and the second initialization TFT T7 may be connected to the previous scan line 132 and driven by the previous scan signal Sn−1. Alternatively, the locations of the source electrodes S1-S7 and the drain electrodes D1-D7 of FIG. 3 may be switched with each other according to the type of a transistor, for example, a p-type or an n-type transistor.

A detailed operation of each of the pixel a PX according to an exemplary embodiment of the present invention is described below.

During an initialization period, when the previous scan signal Sn−1 is supplied through the previous scan line 132, the first initialization TFT T4 is turned on in response to the previous scan signal Sn−1, and the driving TFT T1 is initialized by the initialization voltage Vint supplied through the initialization voltage line 123.

During a data programming period, when the scan signal Sn is supplied through the scan line 131 the switching TFT T2 and the compensation TFT 13 are turned on in response to the scan signal Sn. In this state, the driving TFT T1 is diode-connected by the compensation TFT T3 that is turned on and biased in a forward direction.

Then, a compensation voltage (Dm+Vth, Vth is a (−) value) that is obtained by subtracting the threshold voltage Vth of the driving TFT T1 from the voltage of the data signal Dm supplied through the data line 151 is applied to the driving gate electrode G1 of the driving TFT T1.

The driving power voltage ELVDD and the compensation voltage Dm+Vth are applied to respective ends of the storage capacitor Cst, and electric charges corresponding to the voltage difference between both ends are stored in the storage capacitor Cst.

During an emission period, the operation control TFT T5 and the emission control TFT T6 are turned on by the emission control signal En supplied through the emission control line 121. The drive current $I_{OLED}$ is generated and supplied to the organic light emitting diode OLEO through the emission control TFT T6 according to a voltage difference between the voltage of the driving gate electrode G1 of the driving TFT T1 and the driving power voltage ELVDD.

The display apparatus according to an exemplary embodiment of the present invention may include a shielding conductive layer 141 extending in the second direction from an upper electrode Cst2 of the storage capacitor Cst and connected to the driving voltage line 152. The shielding conductive layer 141 may be provided to prevent parasitic capacitance that may occur between a portion A where the data line 151 is disposed and a portion B for connecting the driving TFT T1 to the compensation TFT T3. For example, portion B may refer to a portion of a node connection line 135 (see FIG. 4) that is not overlapped by the storage capacitor Cst and includes the second node contact hole CNT2 (See FIG. 4). The shielding conductive layer 141 may be connected to the driving voltage line 152 and disposed between the switching TFT 12 and the junction between the compensation TFT 13 and the driving TFT T1 For example, the shielding conductive layer 141 may be disposed in between the compensation drain area D3 of the compensation TFT 13 and the gate electrode G1 of the driving TFT T1.

A display apparatus according to an exemplary embodiment of the present invention is described in detail with reference to layout diagrams and cross-sectional views of FIGS. 4 to 7.

Figure 4:
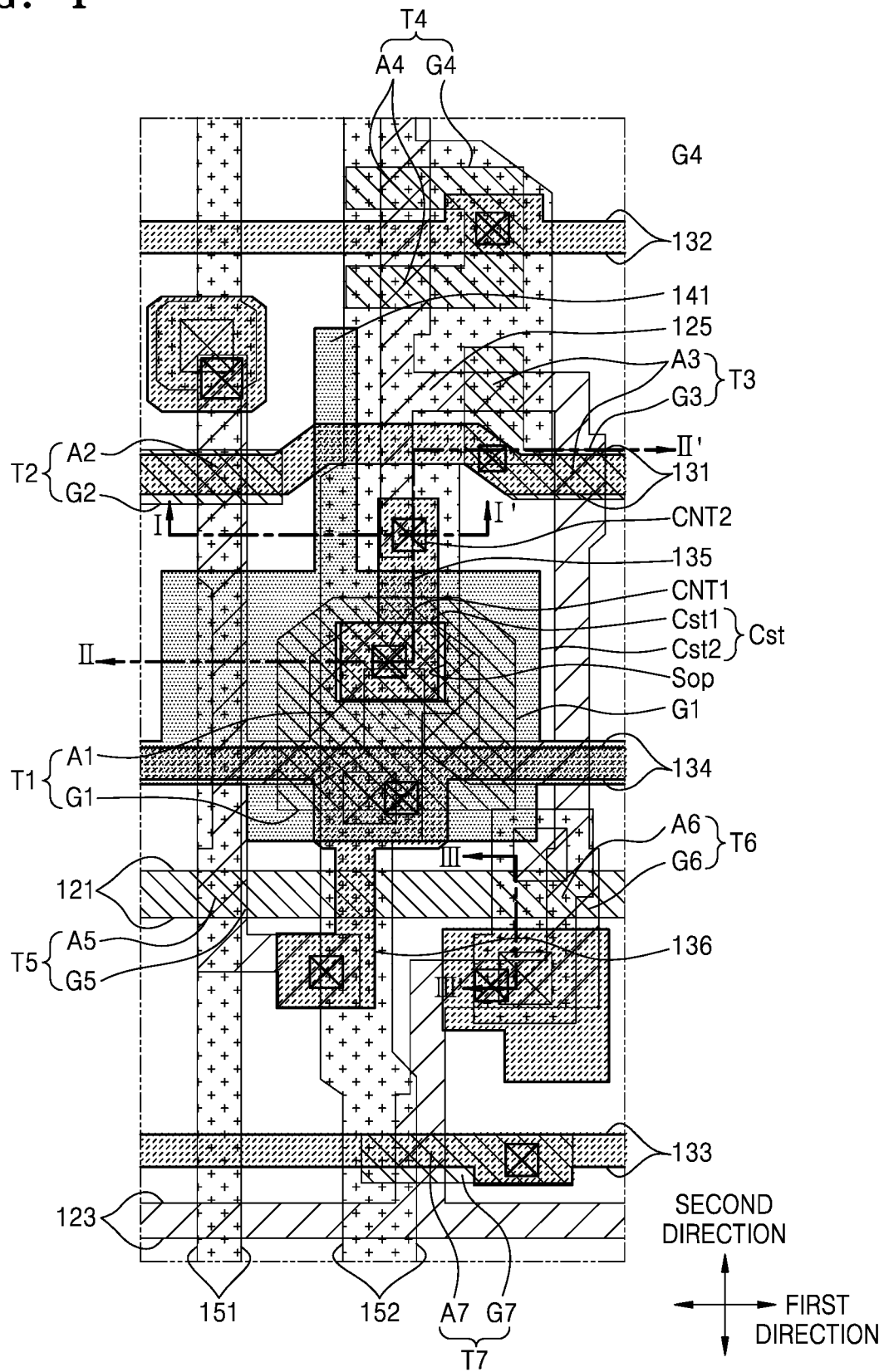
FIG. 4 is a layout diagram schematically illustrating the positions of a plurality of thin film transistors and capacitors included in a pixel circuit, according to an exemplary embodiment of the present invention.
Figure 5:
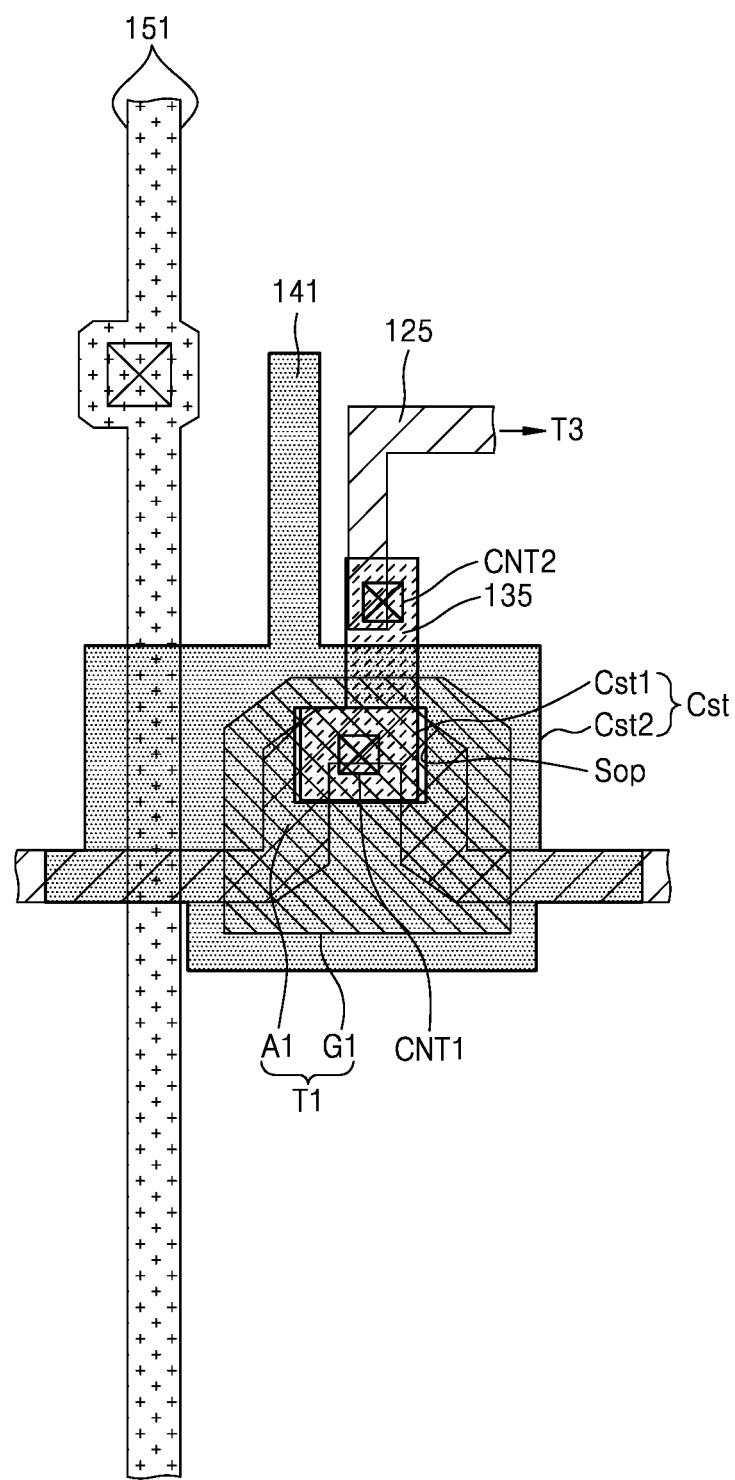
FIG. 5 is an enlarged layout diagram of a shielding conductive layer and particular elements in the vicinity of the shielding conductive layer depicted in FIG. 4.
Figure 6:
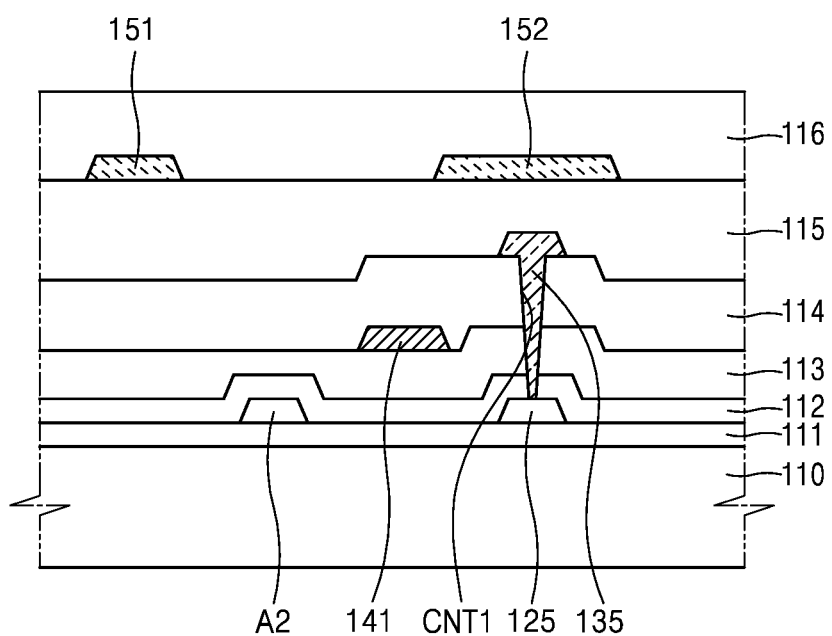
FIG. 6 is a cross-sectional view taken along line I-I' of FIG. 4.
Figure 7:
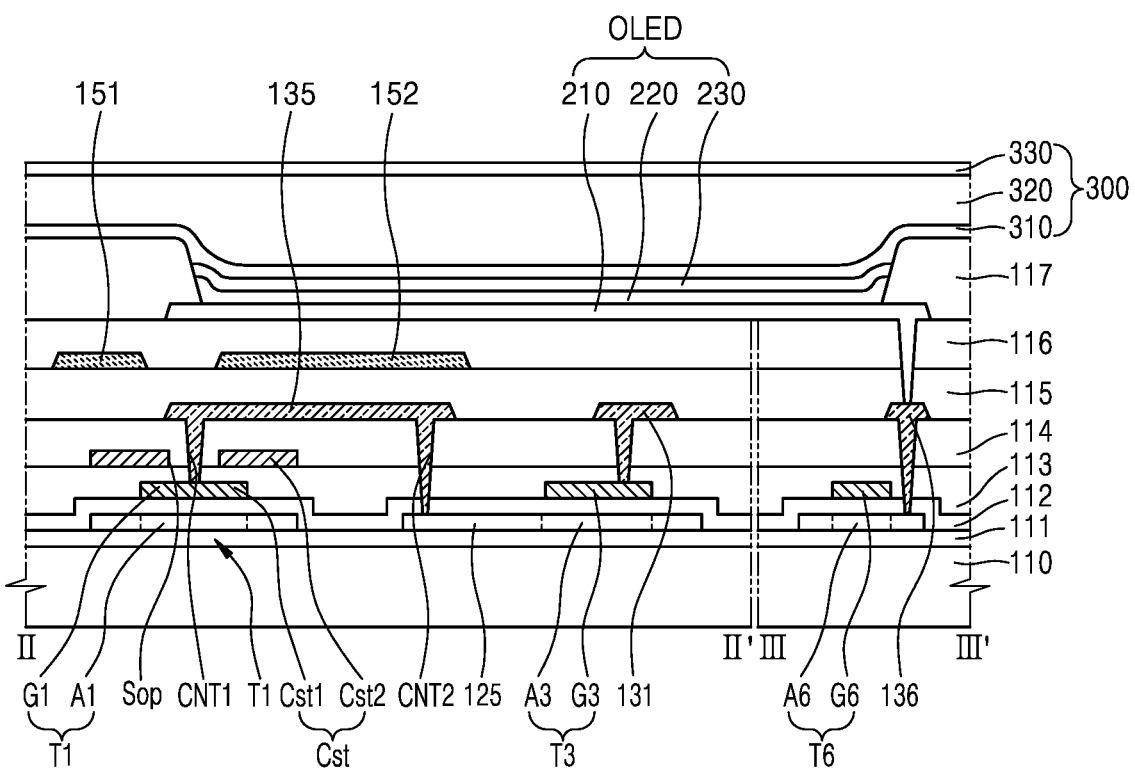
FIG. 7 is a cross-sectional view taken along lines II-II' and III-III' of FIG. 4 illustrating an organic light-emitting diode.

FIG. 4 is a layout diagram schematically illustrating the positions of a plurality of thin film transistors and capacitors included in a pixel circuit, according to an exemplary embodiment of the present invention. FIG. 5 is a layout diagram of a shield conducting layer and select elements in the vicinity of a shielding conductive layer depicted in FIG. 4, FIG. 6 is a cross-sectional view taken along line I-I' of FIG. 4. FIG. 7 is a cross-sectional view taken along lines II-II' and III-III' of FIG. 4, in which an organic light emitting diode OLED is disposed.

As illustrated in FIG. 4 the display apparatus according to an embodiment of the present invention may include the scan line 131, the previous scan line 132, the subsequent scan line 133, a horizontal driving voltage line 134, the emission control line 121, and the initialization voltage line 123, which extend in a first direction, and the data line 151 and the driving voltage line 152, which extend in a second direction crossing the first direction. For example, the first direction and the second direction may be axes substantially perpendicular to one another.

According to an exemplary embodiment of the present invention, the scan line 131, the previous scan line 132, the subsequent scan line 133, and the horizontal driving voltage line 134 may include the same material and may be disposed on a same layer. The scan line 131, the previous scan line 132, and the subsequent scan line 133 may be disposed on a different layer from a layer where the gate electrodes G1-G7 of the TFTs T1-T7 are disposed and may each have a resistance less than the resistance of each of the gate electrodes G1-G7. In other words, the specific resistance value of the scan line 131 may be less than the specific resistance value of each of the gate electrodes G1-G7. Accordingly, an RC delay effect due to application of a scan signal may be prevented or reduced.

For example, the scan line 131, the previous scan line 132, and the subsequent scan line 133 may be disposed on an interlayer insulating layer 114 (See FIGS. 6 and 7) and may include a conductive material including aluminum (Al), copper (Cu), titanium (Ti) and/or molybdenum (Mo) in the form of a multilayer or a single layer including the above material. For example, the scan line 131, the previous scan line 132, and the subsequent scan line 133 may have a multilayer structure of Ti/Al/Ti.

The gate electrodes G1-G7 may be disposed on a first gate insulating layer 112 (See FIGS. 6 and 7) and may include Mo and/or Ti in the form of a single layer or a multilayer. For example, the gate electrode G1 may include a single Mo layer.

A second gate insulating layer 113 and the interlayer insulating layer 114 (See FIGS. 6 and 7) may be disposed between the scan line 131 and the gate electrodes G1-G7. In other words, the scan line 131, the previous scan line 132, and the subsequent scan line 133 are disposed on a different layer from the layer where the gate electrodes G1-G7 connected thereto are disposed. The scan line 131, the previous scan line 132, and the subsequent scan line 133 may be connected to the gate electrodes G1-G7 via contact holes The emission control line 121 may include the same material as that of the gate electrodes G1-G7 and may be disposed on the same layer as the first gate insulating layer 112.

The data line 151 and the driving voltage line 152 and at least a portion of the scan line 131 may have a via layer 115 disposed therebetween. The data line 151 and the driving voltage line 152 may have a specific resistance value similar to that of the scan line 131. For example, the data line 151 and the driving voltage line 152 may include a conductive material including Al, Cu, Ti and/or Mo in the form of a multilayer or a single layer including the above material. For example, the data line 151 and the driving voltage line 152 may have a multilayer structure of Ti/Al/Ti.

The horizontal driving voltage line 134 extending in the first direction may be disposed on another layer and may be connected to the driving voltage line 152 extending in the second direction via a contact hole. Accordingly, the horizontal driving voltage line 134 and the driving voltage line 152 may have a mesh structure.

Furthermore, the display apparatus according to an exemplary embodiment of the present invention may include the driving TFT T1, the switching TFT T2, the compensation TFT T3, the first initialization TFT T4, the operation control TFT T5, the emission control TFT 16, the second initialization TFT 17 and the storage capacitor Cst.

A driving semiconductor layer A1 of the driving TFT T1, a switching semiconductor layer A2 of the switching TFT T2, a compensation semiconductor layer A3 of the compensation TFT T3, a first initialization semiconductor layer A4 of the first initialization TFT T4, an operation control semiconductor layer A5 of the operation control TFT T5, an emission control semiconductor layer A6 of the emission control TFT T6, and a second initialization semiconductor layer A7 of the second initialization TFT T7 may be disposed on the same layer and may include a same material. For example, the semiconductor layers A1-A7 may include polycrystal silicon and/or amorphous silicon. Alternatively, the semiconductor layers A1-A7 may include an oxide semiconductor material including an oxide of material selected from at least one of indium (in), gallium (Ge), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). The semiconductor layers A1-A7 may be connected to each other and may be bent in various shapes.

Each of the semiconductor layers A1-A7 may include a channel area, and a source area and a drain area disposed at both sides of the channel area. According to an exemplary embodiment of the present invention, the source area and the drain area may be doped with impurities, and the impurities may include N-type impurities or P-type impurities. The source area and the drain area correspond to a source electrode and a drain electrode, respectively. In the following description, terms such as a source area and a drain area may be used instead of the source electrode and the drain electrode.

The driving TFT T1 may include the driving semiconductor layer A1, the driving gate electrode G1, the driving source area S1, and the driving drain area D1. The driving semiconductor layer A1 may be bent. The storage capacitor Cst may be provided to at least partially overlap the driving TFT T1 therebelow.

The driving semiconductor layer A1 may include the driving channel area, and the driving source area S1 and the driving drain area D1 disposed at respective sides of the driving channel area. The driving semiconductor layer A1 may have a bent shape so as to be longer than other semiconductor layers A2 to A7. For example, because the driving semiconductor layer A1 may feature multiple interconnected bent segments and have an overall shape like the omega symbol or the letter "S", a long channel length may be obtained within a narrow space. As the driving semiconductor layer A1 is formed with a long channel length, a driving range of a gate voltage applied to the driving gate electrode G1 extends, and thus gradation of light emitted from the organic light emitting diode OLED may be accurately controlled, thereby increasing display quality.

The storage capacitor Cst may include the lower electrode Cst1 and the upper electrode Cst2 which are interposed with the second gate insulating layer 113 disposed therebetween. The driving gate electrode G1 simultaneously works as the lower electrode Cst1. In other words, the driving gate electrode G1 may be formed integrally with the lower electrode Cst1. The second gate insulating layer 113 works as a dielectric of the storage capacitor Cst, and storage capacitance is determined by the electric charges stored in the storage capacitor Cst and the voltage between both the lower electrode Cst1 and the upper electrode Cst2.

The lower electrode Cst1 may be formed, as a floating electrode having an island shape, on the same layer and of a same material as that of the emission control line 121, the switching gate electrode G2, the compensation gate electrode G3, the first initialization gate electrode G4, the operation control gate electrode G5, the emission control gate electrode G6, and the second initialization gate electrode G7.

The upper electrode Cst2 may be disposed on the second gate insulating layer 113. The upper electrode Cst2 may be provided at least partially overlapping the lower electrode Cst1 and may have a storage opening Sop. The storage opening Sop is provided overlapping the lower electrode Cst1. The storage opening Sop may have a shape of a single closed curve penetrating, the upper electrode Cst2. The single closed curve may denote a close line figure such as a polygon or a circle, in which a start point and an end point are identical when a point is marked on a straight line or a curved line. The upper electrode Cst2 may also at least partially overlap the horizontal driving voltage line 134, the driving TFT T1, the emission control TFT T6, the data line 151, and the driving voltage line 152 in a plan view. The upper electrode Cst2 is connected to the driving voltage line 152 via a contact hole and receives the driving power voltage ELVDD.

The switching TFT 12 may include the switching semiconductor layer A2 and the switching gate electrode G2. The switching semiconductor layer A2 may include the switching source area S2 and the switching drain area D2 disposed at respective sides of a switching channel area. The switching drain area D2 may be connected to the driving source area S1.

The compensation TFT T3 may include the compensation semiconductor layer A3 and the compensation gate electrode G3. The compensation semiconductor layer A3 may include the compensation source area S3 and the compensation drain area D3 disposed at respective sides of a compensation channel area. The compensation TFT T3 formed in the compensation semiconductor layer A3 may include two compensation channel areas as a dual thin film transistor. The area between the compensation channel areas may be an area doped with impurities that locally corresponds to a source area of any one of the dual thin film transistor and also to a drain area of the other. The compensation drain area D3 may be connected to the lower electrode Cst1 through a node connection line 135. The compensation gate electrode G3 may prevent leakage of current by forming a separate dual gate electrode.

The first initialization TFT T4 may include the first initialization semiconductor layer A4 and the first initialization gate electrode G4. The first initialization semiconductor layer A4 may include the first initialization source area S4 and the first initialization drain area D4 disposed at respective sides of a first initialization channel area. The first initialization TFT T4 formed in the first initialization semiconductor layer A4 may include two first initialization channel areas. For example, the two first initialization channel areas may be provided as a dual thin film transistor. The area between the first initialization channel areas may be an area doped with impurities and locally corresponds to a source area of any one of the dual thin film transistor and also to a drain area of the other. The first initialization source area S4 may be connected to the lower electrode Cst1 through the node connection line 135. The first initialization drain area D4 may be connected to the initialization voltage line 123.

The operation control TFT 15 may include the operation control semiconductor layer A5 and the operation control gate electrode G5. The operation control semiconductor layer A5 may include the operation control source area S5 and the operation control drain area D5 disposed at respective sides of an operation control channel area. The operation control drain area D5 may be connected to the driving source area S1.

The emission control TFT 16 may include the emission control semiconductor layer A6 and the emission control gate electrode G6. The emission control semiconductor layer A6 may include the emission control source area S6 and the emission control drain area D6 disposed at respective sides of an emission control channel area. The emission control source area S6 may be connected to the driving drain area D1.

The second initialization TFT T7 may include the second initialization semiconductor layer A7 and the second initialization gate electrode G7. The second initialization semiconductor layer A7 may include the second initialization source area S7 and the second initialization drain area D7 disposed at respective sides of the second initialization channel area.

The initialization voltage Fine 123 may be disposed on a same layer as the semiconductor layers A1-A7 and may include a same material as the semiconductor layers A1-A7. The initialization voltage line 123 may be connected to the first initialization drain area D4 of the first initialization TFT T4 and the second initialization drain area D7 of the second initialization TFT T7.

One end of the driving semiconductor layer A1 of the driving TFT T1 may be connected to the Aching semiconductor layer A2 and the operation control semiconductor layer A5, and the other end of the driving semiconductor layer A1 may be connected to the compensation semiconductor layer A3 and the emission control semiconductor layer A6. Accordingly, the driving source electrode S1 may be connected to the switching drain electrode D2 and the operation control drain electrode D5, and the driving drain electrode D1 is connected to the compensation source electrode S3 and the emission control source electrode S6.

The lower electrode Cst1 of the storage capacitor Cst is connected to the compensation TFT T3 and the initialization TFT T4 through the node connection line 135. The node connection line 135 may be disposed on the same layer as a layer where the scan line 131 is disposed. One end of the node connection line 135 may be connected to the lower electrode Cst1 via a first node contact hole CNT1 formed in the second gate insulating layer 113 and the interlayer insulating layer 114. The first node contact hole CNT1 may be disposed inside the storage opening Sop of the upper electrode Cst2. The size of the storage opening Sop may be greater than that of the first node contact hole CNT1 and thus the first node contact hole CNT1 may be connected to the lower electrode Cst1 without contacting the upper electrode Cst2.

The other end of the node connection line 135 may be connected to the compensation drain area D3 and the first initialization drain area D4 via a second node contact hole CNT2 formed in the first gate insulating layer 112, the second gate insulating layer 113, and the interlayer insulating layer 114.

The upper electrode Cst2 of the storage capacitor Cst may be connected to the driving voltage line 152 via a contact hole disposed in the interlayer insulating layer 114 and via layer 115, and may receive the driving power voltage ELVR though the driving voltage line 152.

The switching TFT T2 is used as a switching device to select a pixel to emit light. The switching gate electrode G2 may be connected to the scan line 131 disposed on a different layer via a contact hole. The switching source area S2 may be connected to the data line 151 via a contact hole. The switching drain area D2 is connected to the driving TFT T1 and the operation control TFT T5.

The emission control drain electrode D6 of the emission control TFT T6 may be directly connected to the pixel electrode of the organic light emitting diode OLED via a via hole formed in the via layer 115 and a planarization layer 116.

The display apparatus according to an exemplary embodiment of the present invention may include the shielding conductive layer 141. The shielding conductive layer 141 reduces parasitic capacitance between a portion A where the data line 151 is disposed and a portion B for connecting the driving TFT T1 to the compensation TFT T3.

The shielding conductive layer 141 may extend from the upper electrode Cst2 of the storage capacitor Cst. In other words, the shielding conductive layer 141 may be formed integrally with the upper electrode Cst2 or contiguous therewith. For example, the shielding conductive layer 141 may protrude from one side of the upper electrode Cst2 in the second direction. The shielding conductive layer 141 may be connected to the driving voltage line 152 via a contact hole and may receive the driving power voltage ELVDD that is a DC voltage.

FIG. 5 shows a configuration of the shielding conductive layer 141 and select adjacent elements and FIG. 6 illustrates a cross-sectional view taken along line I-I' of FIG. 4 including the shielding conductive layer 141. Referring to FIG. 5 in a plan view, the shielding conductive layer 141 may be disposed between the data line 151 and the node connection line 135, and/or between the data line 151 and a semiconductor connection line 125. The semiconductor connection line 125 may be a wiring connected to the compensation TFT T3 and may be a part of the compensation drain area D3.

When the shielding conductive layer 141 is not provided, parasitic capacitance occurs between the data line 151 and the node connection line 135, or between the data line 151 and the semiconductor connection line 125, and thus the characteristics of the driving TFT T1 may be changed based on the supply of a signal through the data line 151.

However, the display apparatus according to an exemplary embodiment of the present invention may include the shielding conductive layer 141 which may prevent the occurrence of parasitic capacitance. Furthermore, the shielding conductive layer 141 that receives the driving power voltage ELVDD that is a DC voltage to maintain a constant voltage may reduce the coupling effect by the signal of the data line 151.

The node connection line 135 and the semiconductor connection line 125 may be wirings for connecting the compensation TFT T3 to the driving TFT T1 The node connection line 135 may be disposed on the interlayer insulating layer 114 that is the same layer as a layer where the scan line 131 is disposed. The semiconductor connection line 125 may be disposed on a buffer layer 111 that is a same layer as the layer where the semiconductor layers A1-A7 are disposed. In other words, the data line 151 may be disposed farther from the semiconductor connection line 125 than the node connection line 135. The length of the node connection line 135 may be decreased order to reduce the parasitic capacitance. The node connection line 135 may be connected to the driving gate electrode G1 at a first end and connected to the semiconductor connection line 125 at a second end. The first end may be completely overlapped by the upper electrode Cst2 in a plan view, and a long side of the second end disposed adjacent to the data line 151 may be at least partially surrounded by a side of the shielding conductive layer 141 extending in the second direction. For example, the portion of the node connection line 135 that is not covered by the upper electrode Cst2 (e.g. the second end) may have a shorter length of extension in the second direction than a length of extension of the shielding conductive layer 141 at least partially surrounding it.

Accordingly, in an exemplary embodiment of the present invention, the semiconductor connection line 125 may include a first portion that extends in the second direction that is the same direction as a direction in which the shielding conductive layer 141 extends and a second portion that extends substantially in the first direction. A side of the first portion adjacent to the data line 151 may be completely overlapped by a shielding conductive layer 141. The shielding conductive layer 141 may be disposed between a via of the data line 151 and the second node contact hole CNT2 and at least partially surround both.

The configuration included in the display apparatus according to an exemplary embodiment of the present invention is described with reference to FIG. 7. FIG. 7 is a cross-sectional view taken along lines II-II' and III-III' FIG. 4, in which an organic light-emitting diode OLED is disposed.

A substrate 110 may include a glass member, a ceramic member, a metal member, and/or a flexible or bendable material. When the substrate 110 is flexible or bendable, the substrate 110 may include polymer resin such as polyethersulfone (PES), polyacrylate (PA), polyether imide (PEI), polyethylene naphthalate (PEN), polyethylene terephthalate (PET), polyphenylene sulfide (PPS), polyarylate (PAR), polyimide (Pl), polycarbonate (PC), and/or cellulose acetate propionate (CAP). The substrate 110 may have a single, layer or multilayer structure including at least one of the above materials. For a multilayer structure, the substrate 110 may further include an inorganic layer. According to an exemplary embodiment of the present invention, the substrate 110 may have a structure of an organic material/an inorganic material/an organic material.

The buffer layer 111 may be disposed on the substrate 110 and may prevent or reduce intrusion of foreign materials, moisture or external air into a lower portion of the substrate 110 and provides a planarization surface on the substrate 110. The buffer layer 111 may include an inorganic material such as oxide or nitride, an organic material, and/or an organic/inorganic complex in a single layer or multilayer structure of an inorganic material and an organic material.

A barrier layer may further be provided between the substrate 110 and the buffer layer 111. The barrier layer may prevent or reduce intrusion of impurities from the substrate 110 into the semiconductor layers A1-A7. The barrier layer may include an inorganic material such as oxide or nitride, an organic material, and/or an organic/inorganic complex in a single layer or multilayer structure of an inorganic material and an organic material.

The semiconductor layers A1, A3, and A6 may be disposed on the buffer layer 111. The semiconductor layers A1, A3, and A6 may include amorphous silicon and/or polysilicon. According to an exemplary embodiment of the present invention, the semiconductor layer A1 may include an oxide of at least one material selected from the group consisting of In, Ga, Sn, Zr, V, Hf, Cd, Ge, Cr, Ti, Al, Cs, Ce, and Zn. According to an exemplary embodiment of the present invention, the semiconductor layers A1 A3, and A6 may include a Zn oxide-based material such as Zn oxide (ZnO), In—Zn-oxide (IZO), and/or Ga—In—Zn oxide. According to an exemplary embodiment of the present invention, the semiconductor layer A1 may include In—Ga—Zn—O (IGZO), In—Sn—Zn—O (ITZO), and/or In—Ga—Sn—Zn—O (IGTZO) semiconductor in which metal such as In, Ga, or Sn is contained in ZnO, The semiconductor layers A1, A3, and AB may include the channel area, the source area and the drain area disposed at respective sides of the channel area. The semiconductor layers A1, A3, and A6 may each be a single layer or a multilayer.

The gate electrodes G1 G3, and G6 are disposed on the semiconductor layers A1, A3, and A6 at least partially overlapping the semiconductor layers A1, A3, and A6 with the first gate insulating layer 112 therebetween. The gate electrodes G1 G3, and G6 may include Mo, Al, Cu or Ti in the form of a single layer or a multilayer. According to an exemplary embodiment of the present invention, the gate electrodes G1 G3, and G6 may be a single Mo layer.

The first gate insulating layer 112 may include silicon oxide ($SiO_2$)), silicon nitride ($Si_3N_4$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or ZnO.

The second gate insulating layer 113 may be provided to cover the gate electrodes G1, G3, and G6. The second gate insulating layer 113 may include $SiO_2$, $Si_3N_4$, $SiO_xN_y$, $Al_2O_3$, $TiO_2$, $Ta_2O_5$, $HfO_2$, or ZnO.

The lower electrode Cst1 of the storage capacitor Cst may overlap the driving TFT T1. For example, the driving gate electrode G1 of the driving TFT T1 may also perform a function as the lower electrode Cst1 of the storage capacitor Cst.

The upper electrode Cst2 of the storage capacitor Cst may overlap the lower electrode Cst1 with the second gate insulating layer 113 disposed therebetween. In this case, the second gate insulating layer 113 may function as a dielectric layer of the storage capacitor Cst. The upper electrode Cst2 may include a conductive material including Mo, Al, Cu, or Ti in the form of a multilayer or a single layer including the above material.

The interlayer insulating layer 114 may be provided to cover the upper electrode Cst2 of the storage capacitor Cst. The interlayer insulating layer 114 may include $SiO_2$, $Si_3N_4$, $SiO_xN_y$, $Al_2O_3$, $TiO_2$, $Ta_2O_5$, $HfO_2$, or ZnO.

The scan line 131 and the node connection line 135 may be disposed on the interlayer insulating layer 114. The scan line 131 and the node connection line 135 may include a conductive material including at least one of Al Cu and Ti in the form of a multilayer or a single layer. According to an exemplary embodiment of the present invention, the driving source electrode S1 and the driving drain electrode D1 may have a multilayer structure of Ti/Al/Ti.

One end of the node connection line 135 may be connected to the driving gate electrode G1 via the first node contact hole CNT1 penetrating the interlayer insulating layer 114 and the second gate insulating layer 113. The other end of the node connection line 135 may be connected to the semiconductor connection line 125 via the second node contact hole CNT2 penetrating the interlayer insulating layer 114, the second gate insulating layer 113, and the first gate insulating layer 112. The semiconductor connection line 125 may be wiring extending from the compensation drain area D3 of the compensation TFT T3.

The scan line 131 may be connected to the compensation gate electrode G3 via a contact hole penetrating the interlayer insulating layer 114 and the second gate insulating layer 113. A connection electrode 136 may be connected to the emission control drain area D6 of the emission control TFT T6 via a contact hole penetrating the interlayer insulating layer 114 the second gate insulating layer 113, and the first gate insulating layer 112.

The via layer 115 may be disposed on the scan line 131 the node connection line 135 and the connection electrode 136. The data line 151 and the driving voltage line 152 may be disposed on the via layer 115.

The via layer 115 may include a general polymer for general use such as benzocyclobutene (BCB), Pl, hexamethyldisiloxane (HMDSO), polymethylm thacrylate (PMMA), or polystylene (PS), a polymer derivative having a phenol group, an acrylic polymer, an imide polymer, an aryl ether polymer, an amide polymer, a fluorine polymer, a p-xylene polymer, a vinyl alcohol polymer, and/or a blend thereof. The via layer 115 may include an inorganic material. The via layer 115 may include $SiO_2$, $Si_3N_4$, $SiO_xN_y$, $Al_2O_3$, $TiO_2$, $Ta_2O_5$, $HfO_2$, or ZnO. When the via layer 115 includes an inorganic material, chemical planarization polishing may be performed as necessary. The via layer 115 may include both an organic material and an inorganic material.

The planarization layer 116 may be disposed on the data line 151 and the driving voltage line 152. The planarization layer 116 may include an organic material such as an acryl based compound, BCB, PI, and/or HMDSO. Alternatively, the planarization layer 116 may include an inorganic material. The planarization layer 116 may substantially planarize an upper surface of a protection film covering the TFTs T1-T7. The planarization layer 11 may be provided in the form of a single layer or a multilayer.

An organic light emitting diode OLED has a pixel electrode 210, a counter electrode 230 and an intermediate layer 220 disposed therebetween. An emission layer may be disposed on the planarization layer 116.

The pixel electrode 210 may be connected to the connection electrode 136 via a via hole penetrating the planarization layer 116 and the via layer 115 and to the emission control drain area D6 of the emission control TFT T6 by the connection electrode 136.

A pixel defining layer 117 may be disposed on the planarization layer 116. The pixel defining layer 117 may have an opening corresponding to each sub-pixel. In other words, an opening may expose at least a central portion of the pixel electrode 210, thereby defining a pixel. Furthermore, the pixel defining layer 117 increases a distance between an edge of the pixel electrode 210 and the counter electrode 230 above the pixel electrode 210 to prevent generation of an arc at the edge of the pixel electrode 210. The pixel defining layer 117 may include an organic material such as PI or HMDSO.

The intermediate layer 220 of the organic light emitting diode OLED may include a low molecular weight polymer material. When the intermediate layer 220 includes a low molecular weight material, the intermediate layer 220 may have a structure in which a hole injection layer (HIL), a hole transport layer (HTL), an emission layer (EML), an electron transport layer (ETL), and an electron injection layer (EIL) are stacked in a single or composite structure. The intermediate layer 220 may include various organic materials such as copper phthalocyanine (CuPc), N,N'-Di(naphthalene-1-yl)-N,N'-diphenyl-benzidine (NPB), and/or tris-8-hydroxy-quinoline aluminum ($Alq_3$). These layers may be formed by a vacuum deposition method.

When the intermediate layer 220 includes a polymer material, the intermediate layer 220 may generally have a structure including an HTL and an EML. In this case, the HTL may include poly (3,4-ethylenedioxythiophene) polystyrene sulfonate (PEDOT), and the EML may include a polymer material such as poly p-phenylene vinylene (PPV) or polyfluorene (PFO). The intermediate layer 220 may be formed by a screen print method, an inkjet print method, or a laser induced thermal imaging (LITI) method.

However, the intermediate layer 220 is not necessarily limited thereto, and may have various structures. The intermediate layer 220 may include a layer that is integral across a plurality of the pixel electrodes 210 or may include a layer patterned to correspond to each of the pixel electrodes 210.

The counter electrode 230 may be disposed above the display area DA and may be disposed to cover the display area DA. In other words, the counter electrode 230 may be formed integrally in a plurality of organic light-emitting devices (for example, organic light emitting diode OLED) and may correspond to the pixel electrodes 210.

As the organic light emitting diode OLED is easily damaged by external moisture or oxygen, a thin film encapsulation layer 300 may protect the organic light emitting diode OLED by covering the same. The thin film encapsulation layer 300 may cover the display area DA and extend to the outside of the display area DA. The thin film encapsulation layer 300 may include a first inorganic encapsulation layer 310, an organic encapsulation layer 320, and a second inorganic encapsulation layer 330.

The first inorganic encapsulation layer 310 covers the counter electrode 230 and may include ceramic, metal oxide, metal nitride, metal carbide, metal oxynitride, indium oxide ($In_2O_3$), tin oxide ($SnO_2$), indium tin oxide (ITO), $SiO_2$, $Si_3N_4$ and/or $SiO_xN_y$. As necessary, other layers such as a capping layer may be disposed between the first inorganic encapsulation layer 310 and the counter electrode 230. As the first inorganic encapsulation layer 310 is formed corresponding to an understructure thereof, an upper surface of the first inorganic encapsulation layer 310 may not be flat.

The organic encapsulation layer 320 may cover the first inorganic encapsulation layer 310, and an upper surface of the organic encapsulation layer 320 may be substantially flat unlike the first inorganic encapsulation layer 310, in detail, the upper surface f the organic encapsulation layer 320 may be substantially flat at a portion corresponding to the display area DA. The organic encapsulation layer 320 may include at least one material selected from the group consisting of acrylic, methacryl, polyester, polyethylene, polypropylene, PET, PEN, PC, PI, PEDOT, polyoxymethylene, PAR, and HMDSO.

The second inorganic encapsulation layer 30 may, cover the organic encapsulation layer 320, and may include ceramic, metal oxide, metal nitride, metal carbide, metal oxynitride, $In_2O_3$, $SnO_2$, ITO, $SiO_2$, $Si_3N_4$, and/or $SiO_xN_y$.

As such, the thin film encapsulation layer 300 may include the first inorganic encapsulation layer 310, the organic encapsulation layer 320, and the second inorganic encapsulation layer 330. Due to the above multilayer structure, even when cracks occur in the thin film encapsulation layer 300, such cracks may not be connected between the first inorganic encapsulation layer 310 and the organic encapsulation layer 320 or between the organic encapsulation layer 320 and the second inorganic encapsulation layer 330. Accordingly, the formation of a path along which the external moisture or oxygen intrudes into the display area DA may be prevented or reduced.

A spacer for preventing mask scratches may be further provided on the pixel defining layer 117. Various functional layers such as a polarization layer, a black matrix, a color filter, and/or a touch screen layer with a touch electrode, to reduce external light reflection, may be provided on the thin film encapsulation layer 300.

As described above, according to the above embodiments of the present inventive concept, as the shielding conductive layer extending from one electrode of the storage capacitor is disposed between the node connection line connecting the driving TFT and the data line, crosstalk due to parasitic capacitance may be reduced.

Furthermore, as the scan line having resistance lower than that of the gate electrode of the switching TFT is used, an RC delay effect may be prevented.

While the present invention has been particularly shown and described in reference to exemplary embodiments thereof, it will be understood by those of ordinary skill in the art that various changes in form and detail may be made therein without departing, from the scope of the present invention as defined by the claims.

What is claimed is:

1. A display apparatus comprising:
   a substrate;
   a driving thin film transistor disposed on the substrate, wherein the driving thin film transistor includes a driving semiconductor layer and a driving gate electrode;

a scan line overlapping the substrate and extending in a first direction;

a data line extending in a second direction crossing the first direction, wherein the data line is insulated from the scan line by an insulating layer;

a node connection line disposed on a same layer as the scan line; and a shielding conductive layer disposed between the data line and the node connection line, wherein a first end of the node connection line is connected to the driving gate electrode via a first node contact hole.

2. The display apparatus of claim 1, further comprising a storage capacitor overlapping the driving thin film transistor and having a lower electrode and an upper electrode, wherein the shielding conductive layer extends from a side of the upper electrode.

3. The display apparatus of claim 2, wherein the lower electrode of the storage capacitor is intergrally provided with the driving gate electrode of the driving thin film transistor.

4. The display apparatus of claim 1, further comprising a driving voltage line extending in the second direction and, disposed on a same layer as the data line, wherein the shielding conductive layer is connected to the driving voltage line.

5. The display apparatus of claim 1, further comprising:
a compensation thin film transistor connected to the scan line and including a compensation semiconductor layer and a compensation gate electrode; and
a semiconductor connection line extending from the compensation semiconductor layer,
wherein a second end of the node connection line is connected to the semiconductor connection line via a second node contact hole.

6. The display apparatus of claim 5, wherein each of the shielding conductive layer and the semiconductor connection line includes a portion extending in the second direction.

7. The display apparatus of claim 1, wherein a resistance value of the scan line is less than a resistance value of the driving gate electrode.

8. The display apparatus of claim 1, further comprising a storage capacitor in which the driving gate electrode functions as a lower electrode of the storage capacitor, and having an upper electrode overlapping the lower electrode and having a storage opening,
wherein the first node contact hole is disposed in the storage opening.

9. The display apparatus of claim 8, wherein a size of the storage opening is greater than a size of the first node contact hole.

10. The display apparatus of claim 1, further comprising:
an emission control thin film transistor disposed on the substrate and including an emission control semiconductor layer and an emission control gate electrode; and
emission control lines through which an emission control signal is transmitted to the emission control gate electrode,
wherein the emission control gate electrode is a part of the emission control lines.

11. A display apparatus comprising:
a substrate;
a driving thin film transistor disposed on the substrate and having a d gate electrode and a driving semiconductor layer;

a first gate insulating layer disposed between the driving gate electrode and the driving semiconductor layer;
a second gate insulating layer covering the driving gate electrode;
a shielding conductive layer disposed on the second gate insulating layer;
an interlayer insulating layer covering the shielding conductive layer;
a node connection line disposed on the interlayer insulating layer and connected to the driving gate electrode via a first node contact hole penetrating the interlayer insulating layer and the second gate insulating layer;
a scan line disposed on a same layer as the node connection line, wherein the scan line extends in a first direction;
a via layer covering the scan line and the node connection line; and
a data line disposed on the via layer and extending in a second direction crossing the first direction,
wherein the shielding conductive layer extends in the second direction between the data line and the node connection line.

12. The display apparatus of claim 11, wherein a resistance value of the scan line is less than a resistance value of the driving gate electrode.

13. The display apparatus of claim 11, further comprising a storage capacitor overlapping the driving thin film transistor and having a lower electrode and an upper electrode,
wherein the shielding conductive layer extends from the upper electrode in the second direction.

14. The display apparatus of claim 13, wherein the lower electrode of the storage capacitor is integrally formed with the driving gate electrode of the driving thin film transistor.

15. The display apparatus of claim 13, wherein the upper electrode has a storage opening, the storage opening has a closed curve shape, and the first node contact hole is disposed in the storage opening.

16. The display apparatus of claim 11, wherein the driving semiconductor layer is bent.

17. The display apparatus of claim 11, further comprising, a driving voltage line extending in the second direction and disposed on a same layer as the data line,
wherein the shielding conductive layer receives a direct current (DC) voltage through the driving voltage line.

18. The display apparatus of claim 11, further comprising:
a compensation thin film transistor connected to the scan line and including a compensation semiconductor layer and a compensation gate electrode; and
a semiconductor connection line extending from the compensation semiconductor layer,
wherein an end of the node connection line is connected to the semiconductor connection line via a second node contact hole.

19. The display apparatus of claim 18, wherein each of the shielding conductive layer and the semiconductor connection line includes a portion extending in the second direction.

20. The display apparatus of claim 11, further comprising:
an emission control thin film transistor disposed on the substrate and including an emission control semiconductor layer and an emission control gate electrode; and
an organic light-emitting diode connected to the emission control thin film transistor.

21. The display apparatus of claim 19, wherein the portion of the shielding conductive layer extending in the second direction is longer than the portion of the semiconductor connection line extending in the second direction.

22. The display apparatus of claim 19, wherein the node connection line includes a portion extending in the second direction and the portion of the shielding conductive layer extending in the second direction is longer than the portion of the node connection line extending in the second direction.

23. The display apparatus of claim 21, wherein the shielding conductive layer is disposed between a via of the data line and the second node contact hole and at least partially surrounds both.

* * * * *